United States Patent [19]

Woodford et al.

[11] Patent Number: 4,780,622

[45] Date of Patent: Oct. 25, 1988

[54] APPARATUS FOR REDUCING STRESSES THAT INITIATE RESTRIKE OF BREAKERS IN DISCONNECTING CAPACITOR BANKS

[75] Inventors: Dennis Woodford; Ahmed Glodjo; Trevor Maguire, all of Winnipeg, Canada

[73] Assignee: Manitoba HVDC Research Centre, Winnipeg, Canada

[21] Appl. No.: 141,799

[22] Filed: Jan. 11, 1988

[51] Int. Cl.$^4$ .............................................. H02H 7/22
[52] U.S. Cl. .................................. 307/134; 307/135; 361/5; 361/13; 361/43
[58] Field of Search ............... 307/134, 135, 137, 139; 361/1-18, 102, 110, 111, 112, 114, 115, 118, 119, 120, 124, 130

[56] References Cited

U.S. PATENT DOCUMENTS

| | | | |
|---|---|---|---|
| 3,532,900 | 10/1970 | Rhyne, Jr. .................. | 361/5 |
| 3,955,134 | 5/1967 | Woodford ..................... | 323/61 |
| 4,056,836 | 11/1977 | Knauer ........................ | 361/4 |
| 4,405,965 | 9/1983 | Weldon et al. ................ | 361/43 |
| 4,464,696 | 8/1984 | Masui et al. .................. | 361/43 X |
| 4,485,422 | 11/1984 | Takanashi ..................... | 307/134 X |
| 4,550,356 | 10/1985 | Takahashi ..................... | 361/13 X |
| 4,555,658 | 11/1985 | Hausler et al. ................ | 361/13 X |
| 4,618,905 | 10/1986 | Tokuyama et al. ............. | 361/13 X |
| 4,636,708 | 1/1987 | Whyte .......................... | 361/111 |
| 4,670,810 | 6/1987 | Valeur ......................... | 361/5 |

FOREIGN PATENT DOCUMENTS 1038450 9/1978 Canada .
922946 8/1982 U.S.S.R. .

Primary Examiner—William M. Shoop, Jr.
Assistant Examiner—Paul Ip
Attorney, Agent, or Firm—Adrian D. Battison; Stanley G. Ade; Murray E. Thrift

[57] ABSTRACT

Re-strike in the circuit breaker of a capacitive load applied across an AC voltage power supply is reduced or avoided by connecting across the capacitor bank a tuned discharge circuit. The tuned discharge circuit includes a transformer with a primary connected in parallel with the capacitor bank and a secondary which can be shorted through a switch. The leakage reactance of the transformer is equated to the capacitive reactance of the capacitor bank so that the tuned circuit discharges the capacitor voltage in phase with the supply voltage. The discharge takes place through a number of cycles thus gradually increasing the voltage across the breaker gap. The switch in the secondary preferably comprises an anti-parallel pair of thyristors fired by a circuit responsive to current zero in the capacitive circuit detected over a delay period to avoid firing at normal zero crossing current.

12 Claims, 2 Drawing Sheets

APPARATUS FOR REDUCING STRESSES THAT INITIATE RESTRIKE OF BREAKERS IN DISCONNECTING CAPACITOR BANKS

BACKGROUND OF THE INVENTION

This invention relates to an apparatus for use in an electrical power supply circuit to reduce voltage stresses that can initiate the re-strike of a circuit breaker switch used to disconnect a capacitor bank from the electric power supply circuit.

Capacitor banks are regularly used in electrical power supply circuits for various purposes. In one circumstance, the capacitor is used to improve the power factor of the load when that load is mainly or to a high degree an inductive load. The second purpose of such capacitor banks is to maintain the voltage level at a required level when that voltage would otherwise be lowered due to voltage drop in the transmission system.

In many of these cases it is necessary to disconnect the capacitor bank from the power supply circuit in response to changes in the condition of the power supply circuit which are monitored.

As is well known, there is significant danger when switching of capacitive loads for restriking to occur in the circuit breaker. This phenomenon arises predominantly due to the fact that a breaker gap extinguishes when current in the breaker goes through zero. The current in the capacitor bank goes through zero when the voltage on the capacitor bank is at a peak. Therefore, the peak voltage is trapped on the capacitor bank when the gap extinguishes prior to the reversal of the source voltage. Thus, assuming that the capacitor voltage remains constant and the source voltage continues to cycle, it will be clear that there will be a voltage applied across the extinguished gap within one-half cycle which is 2.0 times the AC peak voltage and it will be of unidirectional polarity. This stress can lead to significantly increased likelihood of re-striking of the circuit breaker gap.

If re-strike does occur, the electric charge from the capacitor flows quickly back through the arc across the breaker gap giving the arc a large amount of energy which can result in circuit breaker failure. In particular, when re-strike occurs, the capacitor voltage immediately attempts to equalize with the system voltage. However, the supply circuit has some inductance and the first peak of that high frequency oscillatory transient of capacitor voltage in fact overshoots system voltage by an amount nearly equal to the difference between the voltages immediately prior to re-strike. The current is typically interrupted at its first high frequency current zero and the overshoot voltage is trapped on the capacitor bank. The recovery voltage reaches a greater magnitude than that following the first interruption but the contacts are moved further apart and the build-up of dielectric strength may prevent additional re-strikes and further voltage escalation. Multiple re-strikes can produce, due to sudden voltage changes and high frequency oscillations, other relatively higher voltages elsewhere on the system. The probability of re-strike and voltage escalation increases with the frequency of capacitor switching operations which can in some cases occur several times a day.

Surge arrestors, instrument transformers and fuses in the power supply circuit may therefore experience voltages significantly above normal values.

A further factor which can lead to restrike is that the voltage across the gap is of single polarity, either positive or negative depending upon whether interruption occurs at the positive or at the negative voltage. The uni-directional nature of the field across the gap aids in the development of avalanche mechanism which is a mechanism which can lead to arc formation and thus to re-strike of a breaker gap.

As the introduction of capacitor banks into the power supply circuit is increasing, many of the existing breakers are no longer satisfactory for switching of the capacitor banks because of the voltage stresses normally associated with switching capacitive load. Much of the expense involved in introducing a capacitor bank can often be attributed to replacing of existing breakers with complex high speed breakers which are specifically designed, at increased cost, to reduce the possibility of re-strike. Various techniques are used in the breaker design which will not be discussed here. It suffices to say, however, that the designs are of a significantly increased complexity and accordingly of significantly increased cost.

SUMMARY OF THE INVENTION

It is one object of the present inventor, therefore, to provide an electrical power supply circuit arrangement in which the possibility of re-strike across the capacitive load circuit breaker is significantly reduced and to provide an attachment device which can be inserted into an existing power supply circuit when the capacitive load is introduced thus enabling the use of existing breaker design.

According to the invention there is provided therefore, an apparatus for use in an electrical power supply circuit arranged to supply an AC voltage at a predetermined frequency, the apparatus comprising:

a circuit breaker switch;

capacitor means being electrically connectable as a capacitive load on said power supply circuit through said circuit breaker switch, said circuit breaker switch being operable for disconnecting in a breaking action said capacitor means from said power supply circuit;

and a discharge circuit link connected across said capacitor means for reducing the voltage stresses across the circuit breaker switch during said breaking action, said discharge circuit link being switchable in impedance between a substantially current blocking mode and a discharge mode, said discharge mode being defined by said discharge circuit link having inductive reactance related to the capacitive reactance of said capacitor means so as to define with said capacitor means a tuned circuit having a tuned frequency substantially equal to said predetermined frequency, said discharge circuit link comprising:

inductor means selected for causing said discharge circuit link to have said inductive reactance in said discharge mode, switch means for switching said discharge circuit link between said substantially current blocking mode and said discharge mode, and means responsive to initiation of said breaking action to cause said switch means to switch said discharge circuit link from said substantially current blocking mode to said discharge mode at a time substantially corresponding to a peak of said AC voltage.

The above arrangement therefore without the necessity of modifications to the breaker design enables the charge trapped on the capacitor at the operation of the circuit breaker to be discharged through the tuned circuit in a damped oscillatory manner so that the voltage on the capacitor remains substantially in phase with the supply voltage with the result that the peak voltage across the breaker gap gradually increases over a number of cycles rather than, in a normal arrangement, decreasing from a maximum greater than the supply voltage as described above.

The use of the transformer arrangement with the switch means included in the secondary side circuit enables the voltage in the secondary side circuit to be reduced by a factor equal to the turns ratio of the transformer. Thus use of the transformer arrangement enables the voltage rating of the secondary side switch to be reduced accordingly.

In order to actuate the switch, a detection circuit can be provided which samples the current across the circuit breaker repeatedly so that only when the current has remained zero for a number of samples is a switch actuated. In practise this can be done with a period of 0.25 milliseconds during which time the control circuit can carry out approximately twenty-five trials sampling the current. The detection of the initial arc extinction in the circuit breaker switch occurs substantially at a zero of capacitive load current which corresponds to a peak of AC voltage.

With the foregoing in view, and other advantages as will become apparent to those skilled in the art to which this invention relates as this specification proceeds, the invention is herein described by reference to the accompanying drawings forming a part hereof, which includes a description of the best mode known to the applicant and of the preferred typical embodiment of the principles of the present invention, in which:

DETAILED DESCRIPTION

Figure 1:
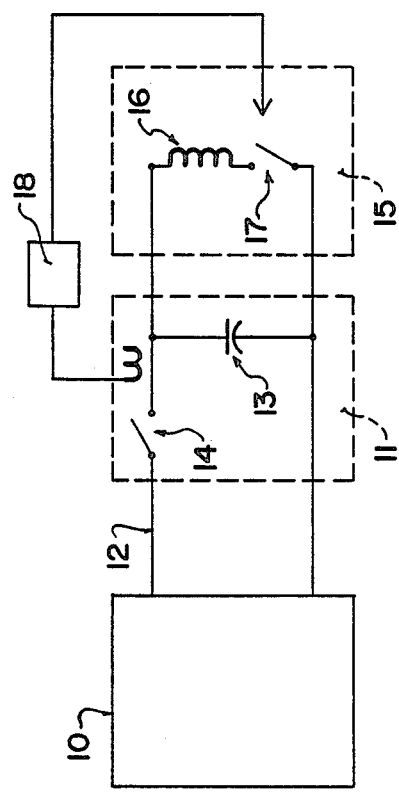
FIG. 1 is a functional block diagram of a first embodiment of apparatus according to the present invention.
Figure 2:
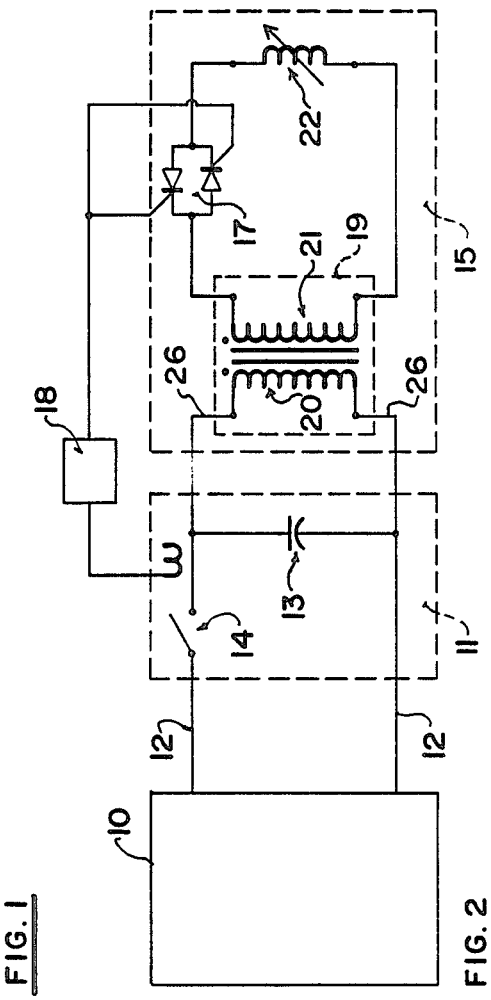
FIG. 2 is a schematic view of a second embodiment of the apparatus according to the present invention.

The electrical power supply circuit is generally indicated at 10 in FIGS. 1 and 2 with the power supply circuit supplying an AC voltage at a frequency determined by the system in which it is used which will generally in the North American power network be sixty cycles/second. The voltage under which the power supply is operating will be chosen in accordance with the specific requirements and can vary from the very large line transmission voltages down to household voltage supply of 110 volts.

A capacitor bank circuit generally is applied to the power supply circuit 10 by way of buswork 12. The capacitor bank is schematically indicated at 13 and has a capacitance and voltage rating selected in accordance with the required use. A breaker 14 is schematically indicated and comprises a conventional circuit breaker used to disconnect the capacitive load 13 from the power supply circuit. Such arrangements including the power supply circuit 10 and the capacitor bank circuit 11 are well known and are used in many circumstances.

As described above the operation of the circuit breaker 14 to disconnect the capacitor bank 13 generates problems of re-strike and these problems are resolved by the provision of an additional discharge circuit 15 forming a link across the capacitor terminals. The discharge circuit 15 includes an inductor 16 and a switch 17 together with an actuator schematically indicated at 18 which is arranged to close the switch 17 to introduce the inductor 16 into the discharge circuit.

In the embodiment shown in FIG. 2 the inductance provided by inductor 16 in FIG. 1 is provided instead by a transformer 19 and an adjustable inductor 22 connected in the circuit on the secondary side of the trasformer. The primary winding 20 of transformer 19 is connected in parallel with the capacitor 13. The secondary winding of the transformer indicated at 21 is connected into a secondary circuit including switch 17 and the adjustable inductor 22.

The values of the inductances of the transformer 19 and the variable inductor 22 are chosen so that the inductive reactance observable in the discharge circuit 15 at terminals 27 when switch 17 is closed is substantially equal to the capacitive reactance defined by the capacitor bank 13.

The calculation of the inductance value is as follows:

$$X_l = X_c$$

$$W \cdot L = 1/W \cdot C$$

$$f = W/2 = \tfrac{1}{2} \cdot L \cdot C$$

and for f=60 Hz $$\begin{aligned} L &= 1/[(2 \cdot f)^2 \cdot C] \\ &= 1/(376.991^2 \times C) \\ &= 7.036 \times 10^{-6}/C \end{aligned}$$

where L is in Henries and C is in Farads.

When the inductor 16 in FIG. 1 is provided by the discharge circuit link 15 as shown in FIG. 2, the transformer 19 can be chosen so that its leakage reactance as seen from the capacitor bank side is equal to the capacitive reactance of the capacitor bank. In such a case, variable inductor 22 can be omitted from the secondary circuit. Thus the capacitor bank and the transformer leakage reactance can form a tuned circuit which will have a frequency of substantially the same frequency as the power supply circuit (generally 60 Hz) as calculated above.

Figure 3:
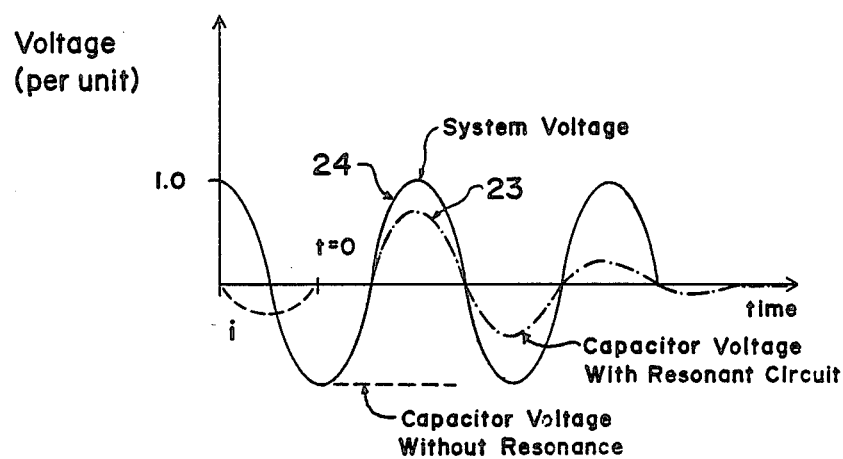
FIG. 3 is a graph representing in time the system voltage and the voltage across the capacitor as that voltage is discharged through the circuit of FIG. 2.

In FIG. 3 the voltage of the capacitor is indicated at the chain dot line 23. It will be noted, that in view of the tuned discharge circuit, the voltage on the capacitor bank 23 is discharged ina damped oscillatory manner in phase with the supply voltage indicated at 24. The discharge of the capacitor voltage commences, as explained hereinfter, 0.25 milliseconds behind the supply voltage but this is a small time period in relation to the cycle length of 16.67 milliseconds (at 60 Hz).

Figure 4:
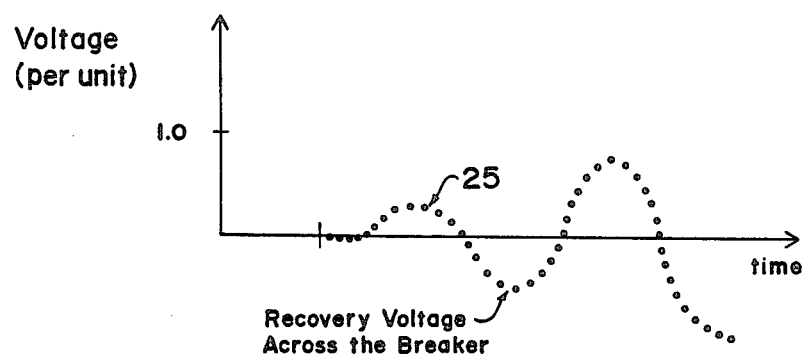
FIG. 4 is a graph similar to that of FIG. 3 showing the voltage applied across the breaker due to the system voltage and capacitor voltage.

In FIG. 4 there is shown the voltage across the breaker as indicated in dot line at 25. This is of course calculated by merely subtracting the voltages of FIG. 3 so that in the first half cycle the voltage across the breaker is substantially zero and this gradually increases up to 1.0 per unit after a number of cycles.

The number of cycles over which the voltage discharges can be varied by altering the resistance in the secondary circuit. The resistance in the secondary circuit can be increased from the minimum provided by the transformer secondary winding by introducing a variable resistance (not shown) in the secondary circuit.

In a particularly preferred arrangement, the variable inductor 22 is omitted and the transformer 19 is chosen so that it has an inductive leakage reactance observable at the terminals 26 of the primary winding 20 directly equal to the capacitive reactance of the capacitor bank 13.

The design of such a transformer can vary according to engineering requirements as will be apparent to one skilled in the art but the following is preferred.

In addition to choosing the leakage reactance of the transformer as described above, the transformer designer should provide adequate physical bracing within the transformer and adequate thermal capacity and heat dissipating capacity in the transformer in accordance with the duty that the transformer will experience in use.

The duty on the transformer is determined by the nature of the application. During normal operation of the capacitor bank the transformer windings will conduct only a small current corresponding to the magnetizing current of the transformer. It is only when the capacitor bank 13 is to be disconnected from the power supply that the transformer is required to conduct currents of magnitude equal to those conducted by the capacitor bank. However, these currents will decay in magnitude due to the losses in the tuned circuit and the transformer currents will reach low levels within a predeterminable time period typically less than 10 cycles in duration depending on the selected resistance in the tuned circuit. Thus the transformer is required to conduct currents approximately equal to those conducted by the capacitor bank but only for relatively short period described above.

Given the magnitude of current to be conducted by the transformer as described above it is within the ability of experienced power transformer designers to provide adequate physical bracing in the transformer to counteract forces generated in the transformer due to these currents. In addition, it is within the knowledge of experienced power transformer designers to design the transformer to have sufficient thermal capacity and heat dissipating capacity to permit the transformer to conduct the currents described above without damage to windings or winding insulation due to overheating.

The switch 17 in the embodiment of FIG. 2 is provided by a pair of thyristors in anti-parallel arrangement which are actuated or fired by the detecting device 18. The device 18 is shown only schematically but comprises a control circuit which will produce firing pulses to the thyristors at the desired instant. The control circuit monitors the main circuit current through a current sensing device or current transformer which is connected in the main circuit. The thyristor control circuit is set to sense a breaker gap current zero lasting for about 0.25 milliseconds to avoid firing the thyristors due to a normal current zero crossing which is typically of much shorter duration. During the detection of the extended current zero, the electronic circuit is checking current zero value in about 25 trials. After 0.25 milliseconds of current zero the control circuit fires the thyristors on and the capacitor bank discharges through the tuned circuit. At the instant of thyristor switching on, the capacitor bank voltage oscillates at the tuned frequency with decreasing magnitude and becomes zero after several cycles depending upon the resistance of the tuned circuit. The tuned frequency is typically 50 or 60 Hz.

While the circuit breaker is closed the transformer will normally have an open circuit on the secondary. When the circuit breaker opens in the embodiment of FIG. 1, switch 17 closes within a fraction of one millisecond after current zero and stays closed for a period of cycles (e.g. 10 cycles) before opening.

Starting when switch 17 closes the capacitor voltage oscillates with frequency 60 Hz and decays because of secondary circuit losses. The voltage across the circuit breaker after the first half cycle is only a fraction of 1.0 p.u. and increases slowly during several cycles to a maximum value of 1.0 p.u. This compares favourably with the 2.0 p.u. voltage across the gap which would otherwise conventionally occur. The desired time for capacitor discharge can be controlled by locating appropriate additional resistance in series with switch 17.

A laboratory model has been built and confirms the successful operation as described above.

The apparatus used in the model was substantially as shown in FIG. 2. A laboratory power supply provided 2100 volts alternating current (AC) at 60 Hz in place of the power supply circuit 10.

A distribution class capacitor unit was provided in place of capacitor bank 13. The capacitor unit had a rating of 7200 volts and a capacitance of 2.5 microfarads. At 60 Hz, 2.5 microfarads corresponds to a capacitive reactance of approximately 1061.03 ohms. A capacitor with a voltage rating of 7200 volts was selected as opposed to a 2100 volt unit in order to provide a margin of safety for re-strikes and voltage escalation. Since multiple re-strikes were expected during the experiments without the re-strike avoidance device, a surge arrestor rated at 6300 volts was connected across the capacitor bank terminals for further protection. This surge arrestor would prevent the voltage from going higher than the 7200 volt rating of the capcitor bank during multiple re-strikes. Considerable care was taken in protecting the capacitor unit because capacitors have been known to fail violently due to overvoltage.

The circuit breaker 14 was provided by a mechanical breaker device which was designed and built to be susceptible to the occurrence of re-strike. The speed of the breaker contacts was measured by using a high speed movie camera. Contact travel was completed in 32 frames when the film speed was 1200 frames per second. That corresponds to 26.7 milliseconds for the opening of the contacts.

The transformer 19 was provided by a single phase distribution transformer which was rated at 5.0 kVA and had a primary winding voltage rating of 2300 volts and a secondary winding voltage rating of 230 volts. The leakage reactance of the distribution transformer was 0.027 per unit on a per unit base for the primary side of the transformer of 1058 ohms. Thus with the secondary winding of the transformer in the experimental apparatus short-circuited, the primary winding of the distribution would have presented an impedance of approximately 0.027 p.u. times 1058 ohms equal to 28.57 ohms.

The discharge circuit 15 in the experimental apparatus was required to present to the capacitor unit during discharge an impedance having an inductive reactive component approximately equal in magnitude to the 1061.03 ohm capacitive reactance of the capacitor bank. Thus an adjustable inductor 22 was provided in the secondary side circuit of the transformer in the experimental apparatus. In selecting the adjustable inductor 22 it is necessary to consider its effect on the impedance of the discharge circuit as seen at the primary winding of transformer 19. The actual impedance of the adjustable inductor can be referred to the primary side winding by multiplying the actual impedance by n squared where n is the ratio of primary to secondary transformer voltage ratings. In the experimental circuit the adjustable inductor was necessary to compensate for the difference between the 28.57 ohm inductive leakage reactance of the transformer as observed at the primary winding and the 1061.03 ohm capacitive reactance of the capacitor bank. The difference between 1061.03 ohms and 28.57 ohms is 1032.46 ohms as seen at the primary of the transformer. The transformer turns ratio of the transformer in the experimental apparatus is 10 as calculated by dividing the primary winding voltage rating by the secondary winding voltage rating. Thus the adjustable inductor 22 required a setting of approximately 10.32 ohms for 60 Hz operation. The use of the adjustable inductor 22 allowed the capacitor bank 13 and the discharge circuit 15 to be tuned to oscillate at 60 Hz.

The switch 17 was provided in the experimental apparatus by means of a solid-state electronic switch device. In particular, two thyristors connected in an antiparallel arrangement were provided.

The detecting device 18 provided in the experimental apparatus operated substantially as described above and its construction will be apparent to one skilled in the art.

The above experimental apparatus enabled the circuit breaker switch to avoid re-striking even though the breaker was designed to be susceptible to re-strike. Furthermore, if the apparatus for reducing stresses was disabled the breaker would in fact re-strike on almost every breaker switch opening.

With the reduced probability of re-strike there will be an increase in the wear lifetime of the contacts; a reduction in maintenance; and an increase in the reliability of the breaker. In addition, the ability of the apparatus to reliably prevent re-strike during switching may eliminate the need for opening resistors on the breaker system. Opening resistors reduce the effect of a re-strike on the AC system. In addition, if the capacitor bank circuit breaker fails to open for any reason, an operation of the apparatus may allow general-purpose back-up breakers to switch off the capacitive load without any concern regarding re-strike.

During normal operation, the capacitor bank will be totally discharged in a few cycles. This fast discharge presents the possibility of fast reclosing of the circuit breaker switch should that be desired.

The use of the transformer 19 in the discharge circuit of FIG. 2 permits the voltage rating of switch 17 to be much lower than it would need to be if the switch 17 were located on the primary side of the transformer 19. Furthermore, should switch 17 fail to close at the appropriate time due to a malfunction of the detection device 18, the voltage trapped on capacitor 13 acting over time on the transformer 19 can cause the magnetizing flux linkage of transformer 19 to saturate with the result that the charge on capacitor 13 will be discharged through the discharge circuit link.

Since various modifications can be made in my invention as hereinabove described, and many apparently widely different embodiments of same made within the spirit and scope of the claims without departing from such spirit and scope, it is intended that all matter contained in the accompanying specification shall be interpreted as illustrative only and not in a limiting sense.

We claim:

1. Apparatus for use in an electrical power supply circuit arranged to supply an AC voltage at a predetermined frequency, the apparatus comprising:

a circuit breaker switch;

capacitor means being electrically connectable as a capacitive load on said power supply circuit through said circuit breaker switch, said circuit breaker switch being operable for disconnecting in a breaking action said capacitor means from said power supply circuit;

and a discharge circuit link connected across said capacitor means for reducing the voltage stresses across the circuit breaker switch during said breaking action, said discharge circuit link being switchable in impedance between a substantially current blocking mode and a discharge mode, said discharge mode being defined by said discharge circuit link having inductive reactance related to the capacitive reactance of said capacitor means so as to define with said capacitor means a tuned circuit having a tuned frequency substantially equal to said predetermined frequency, said discharge circuit link comprising:

inductor means selected for causing said discharge circuit link to have said inductive reactance in said discharge mode, switch means for switching said discharge circuit link between said substantially current blocking mode and said discharge mode, and means responsive to initiation of said breaking action to cause said switch means to switch said discharge circuit link from said substantially current blocking mode to said discharge mode at a time substantially corresponding to a peak of said AC voltage.

2. The invention as claimed in claim 1 wherein said switch means is a solid-state electronic switch means adapted for switching voltages and currents of said discharge circuit.

3. The invention according to claim 1 wherein said means responsive comprises means for repeatedly sampling current magnitude through said circuit breaker switch; means for detecting substantially zero current for a repeated number of samples; and means for causing said switch means to switch said discharge circuit link to said discharge mode on said detection.

4. Apparatus for use in an electrical power supply circuit arranged to supply an AC voltage at a predetermined frequency, the apparatus comprising:

a circuit breaker switch;

capacitor means being electrically connectable as a capacitive load on said power supply circuit through said circuit breaker switch, said circuit breaker switch being operable for disconnecting in a breaking action said capacitor means from said power supply circuit;

and a discharge circuit link connected across said capacitor bank for reducing the voltage stresses across the circuit breaker switch during said breaking action said discharge circuit link being switchable in impedance between a substantially current blocking mode and a discharge mode;

said discharge mode being defined by said discharge circuit link having inductive reactance related to the capacitive reactance of said capacitor means so as to define with said capacitor means a tuned circuit having a tuned frequency substantially equal to said predetermined frequency, said discharge circuit link comprising:

transformer means having a primary winding and a secondary winding, and a secondary circuit link connected across said secondary winding of said transformer means, said transformer means and secondary side circuit link being selected for causing said discharge circuit to have said inductive reactance in said discharge mode, said secondary side circuit link including switch means for switching said discharge circuit link between said substantially current blocking mode and said discharge mode, and means responsive to initiation of said breaking action to cause said switch means to switch said discharge circuit link from said substantially current blocking mode to said discharge mode at a time substantially corresponding to a peak of said AC voltage.

5. The invention as claimed in claim 4 wherein said switch means is a solid-state electronic switch means adapted for switching voltages and currents of said discharge circuit.

6. The invention according to claim 4 wherein said means responsive comprises means for repeatedly sampling current magnitude through said circuit breaker switch; means for detecting substantially zero current for a repeated number of samples; and means for causing said switch means to switch said discharge circuit link to said discharge mode on said detection.

7. For use in an electrical power supply circuit arranged to supply an AC voltage at a predetermined frequency and including a circuit breaker switch and a capacitor bank being electrically connectable as a capacitive load on said power supply circuit through said circuit breaker switch, said circuit breaker switch being operable for disconnecting in a breaking action said capacitor bank from said power supply circuit:

an apparatus for reducing the voltage stresses across the circuit breaker switch during said breaking action said apparatus comprising:

a discharge circuit link connected across said capacitor bank, said discharge circuit link being switchable in impedance between a substantially current blocking mode and a discharge mode, said discharge mode being defined by said discharge circuit link having inductive reactance related to the capacitive reactance of said capacitor bank so as to define with said capacitor bank a tuned circuit having a tuned frequency substantially equal to said predetermined frequency, said discharge circuit link comprising:

inductor means selected for causing said discharge circuit link to have said inductive reactance in said discharge mode, switch means for switching said discharge circuit link between said substantially current blocking mode and said discharge mode, and means responsive to initiation of said breaking action to cause said switch means to switch said discharge circuit link from said substantially current blocking mode to said discharge mode at a time substantially corresponding to a peak of said AC voltage.

8. The invention as claimed in claim 7 wherein said switch means is a solid-state electronic switch means adapted for switching voltages and currents of said discharge circuit.

9. The invention according to claim 7 wherein said means responsive comprises means for repeatedly sampling current magnitude through said circuit breaker switch; means for detecting substantially zero current for a repeated number of samples; and means for causing said switch means to switch said discharge circuit link to said discharge mode on said detection.

10. For use in an electrical power supply circuit arranged to supply an AC voltage at a predetermined frequency and including a circuit breaker switch and a capacitor bank being electrically connectable as a capacitive load on said power supply circuit through said circuit breaker switch, said circuit breaker switch being operable for disconnecting in a breaking action said capacitor bank from said power supply circuit:

an apparatus for reducing the voltge stresses across the circuit breaker switch during said breaking action said apparatus comprising:

a discharge circuit link connected across said capacitor bank said discharge circuit link being switchable in impedance betwen a substantially current blocking mode and a discharge mode;

said discharge mode being defined by said discharge circuit link having inductive reactance related to the capacitive reactance of said capacitor bank so as to define with said capacitor bank a tuned circuit having a tuned frequency substantially equal to said predetermined frequency, said discharge circuit link comprising:

transformer means having a primary winding and a secondary winding;

and a secondary side circuit link connected across said secondary winding of said transformer means;

said transformer means and secondary side circuit link being selected for causing said discharge circuit to have said inductive reactance in said discharge mode;

said secondary side circuit link including switch means for switching said discharge circuit link between said substantially current blocking mode and said discharge mode, and means responsive to initiation of said breaking action to cause said switch means to switch said discharge circuit link from said substantially current blocking mode to said discharge mode at a time substantially corresponding to a peak of said AC voltage.

11. The invention as claimed in claim 10 wherein said switch means is a solid-state electronic switch means adapted for switching voltages and currents of said discharge circuit.

12. The invention according to claim 10 wherein said means responsive comprises means for repeatedly sampling current magnitude through said circuit breaker switch; means for detecting substantially zero current for a repeated number of samples; and means for causing said switch means to switch said discharge circuit link to said discharge mode on said detection.

* * * * *